(12) United States Patent
Wilmot et al.

(10) Patent No.: US 7,355,300 B2
(45) Date of Patent: Apr. 8, 2008

(54) SOLID STATE TURBINE ENGINE IGNITION EXCITER HAVING ELEVATED TEMPERATURE OPERATIONAL CAPABILITY

(75) Inventors: Theodore S. Wilmot, Fort Collins, CO (US); Richard S. Brzostek, Rockford, IL (US); John C. Driscoll, Raleigh, NC (US)

(73) Assignee: Woodward Governor Company, Fort Collins, CO (US)

(*) Notice: Subject to any disclaimer, the term of this patent is extended or adjusted under 35 U.S.C. 154(b) by 412 days.

(21) Appl. No.: 10/868,621

(22) Filed: Jun. 15, 2004

(65) Prior Publication Data

US 2005/0276000 A1    Dec. 15, 2005

(51) Int. Cl.
*B60R 22/00* (2006.01)
*F02P 9/00* (2006.01)
*H02G 3/00* (2006.01)

(52) U.S. Cl. .................................... 307/10.6
(58) Field of Classification Search ............... 307/10.6; 361/155, 156
See application file for complete search history.

(56) References Cited

U.S. PATENT DOCUMENTS

| | | | |
|---|---|---|---|
| 2,717,335 A | 9/1955 | Sims et al. | 315/183 |
| 2,980,822 A | 4/1961 | Short | 315/180 |
| 3,045,148 A | 7/1962 | McNulty et al. | 315/183 |
| 3,049,642 A | 8/1962 | Quinn | 315/206 |
| 3,169,212 A | 2/1965 | Walters | 315/223 |
| 3,176,158 A | 3/1965 | Guignard | 327/124 |
| 3,223,887 A | 12/1965 | Brown | 315/223 |
| 3,240,198 A | 3/1966 | Loudon et al. | 123/406.57 |
| 3,302,629 A | 2/1967 | Shano | 123/598 |
| 3,331,033 A | 7/1967 | Johnston | 331/111 |
| 3,424,945 A | 1/1969 | Seider et al. | 315/240 |
| 3,450,942 A | 6/1969 | Segall et al. | 315/209 CD |
| 3,504,658 A | 4/1970 | Chavis | 123/604 |

(Continued)

FOREIGN PATENT DOCUMENTS

CH    124406    12/1925

(Continued)

OTHER PUBLICATIONS

G. Geoffrey Smith, "Gas Turbines and Jet Propulsion for Aircraft", 4th Edition, 1946, p. 78.

(Continued)

*Primary Examiner*—Michael Sherry
*Assistant Examiner*—Carlos Amaya
(74) *Attorney, Agent, or Firm*—Greer, Burns & Crain, Ltd.

(57) ABSTRACT

A turbine engine ignition exciter circuit applies energy stored in the exciter tank capacitor to the load (igniter plug) through a thyristor type semiconductor switching device that minimizes leakage current at elevated operating temperatures. The semiconductor switching device is periodically activated by a trigger circuit to initiate discharge of energy stored in exciter tank capacitor to mating ignition lead and igniter plug. The circuit operates at a modest, for example, approximately 1.8 kV, tank circuit voltage to further reduce switching device leakage current related stresses at elevated temperatures allowing relatively long capacitor charge cycles, increased upper operating temperature capability and improved reliability. The circuit uses a low side switch circuit topology for releasing energy from said capacitor to ground whereby negative polarity energy is applied to the exciter.

48 Claims, 11 Drawing Sheets

U.S. PATENT DOCUMENTS

| | | | | |
|---|---|---|---|---|
| 3,505,563 A | 4/1970 | Randall et al. | | 315/213 |
| 3,546,528 A | 12/1970 | Fisher | | 315/209 CD |
| 3,560,833 A | 2/1971 | Oishi et al. | | 363/18 |
| 3,569,727 A | 3/1971 | Aggarwal et al. | | 307/106 |
| 3,600,887 A | 8/1971 | Gault et al. | | 60/39.14 |
| 3,635,202 A | 1/1972 | Issler et al. | | 123/148 E |
| 3,681,001 A | 8/1972 | Potts | | 431/264 |
| 3,750,637 A | 8/1973 | Minks | | 123/148 E |
| 3,839,659 A | 10/1974 | Bruijning et al. | | 315/209 SC |
| 3,852,623 A | 12/1974 | Nelson et al. | | 307/293 |
| 3,857,376 A | 12/1974 | Williams | | 123/148 E |
| 3,918,425 A | 11/1975 | Pulzer | | 123/148 E |
| 4,027,198 A | 5/1977 | Linkroum | | 315/209 CD |
| 4,129,895 A | 12/1978 | Witting | | 361/257 |
| 4,167,767 A | 9/1979 | Courier de Mere | | 361/256 |
| 4,479,467 A | 10/1984 | Burrows et al. | | |
| 4,502,454 A | 3/1985 | Hamai et al. | | 123/597 |
| 4,510,915 A | 4/1985 | Ishikawa et al. | | 123/620 |
| 4,558,280 A | 12/1985 | Koehl et al. | | 324/399 |
| 4,688,538 A | 8/1987 | Ward et al. | | 123/598 |
| 4,696,280 A | 9/1987 | Niggemeyer | | 123/598 |
| 4,758,790 A | 7/1988 | Hunt | | 324/379 |
| 4,760,341 A | 7/1988 | Skerritt | | 324/379 |
| 4,783,991 A | 11/1988 | Wixon | | 73/117.3 |
| 4,825,167 A | 4/1989 | Bayba | | 324/399 |
| 4,829,971 A | 5/1989 | Minks | | 123/598 |
| 4,922,396 A | 5/1990 | Niggemeyer | | 363/21 |
| 5,032,969 A | 7/1991 | Eggers et al. | | 363/21 |
| 5,053,913 A | 10/1991 | Lozito et al. | | 361/257 |
| 5,065,073 A | 11/1991 | Frus | | 315/209 R |
| 5,155,437 A | 10/1992 | Frus | | |
| 5,197,448 A | 3/1993 | Porreca et al. | | 123/620 |
| 5,245,252 A | 9/1993 | Frus et al. | | |
| 5,247,422 A | 9/1993 | Miller | | 361/632 |
| 5,343,154 A | 8/1994 | Frus | | |
| 5,347,422 A | 9/1994 | Smith et al. | | 361/253 |
| 5,561,350 A | 10/1996 | Frus et al. | | 315/209 R |
| 5,592,118 A | 1/1997 | Wilmot et al. | | |
| 5,621,278 A | 4/1997 | Chambers | | |
| 5,656,966 A | 8/1997 | Wilmot et al. | | |
| 5,852,381 A | 12/1998 | Wilmot et al. | | |
| 5,862,033 A | 1/1999 | Geislinger et al. | | 361/257 |
| 6,052,270 A | 4/2000 | Kinge | | 361/253 |
| 6,112,730 A | 9/2000 | Marrs et al. | | 123/606 |
| 6,191,537 B1 | 2/2001 | Celso | | 315/219 |
| 6,670,777 B1 | 12/2003 | Petruska et al. | | |

FOREIGN PATENT DOCUMENTS

| | | |
|---|---|---|
| DE | 1 539 195 | 3/1972 |
| DE | 2 040 913 | 3/1973 |
| DE | 27 24 797 | 11/1978 |
| DE | 3120254 | 5/1982 |
| DE | 3731412 | 5/1988 |
| EP | 0 020 069 | 12/1980 |
| EP | 0 046 578 | 3/1982 |
| EP | 0 125 820 | 11/1984 |
| EP | 0 226 302 | 6/1987 |
| EP | 0 228 840 | 7/1987 |
| EP | 0 277 468 | 8/1988 |
| EP | 0 369 236 | 5/1990 |
| EP | 0 384 436 | 8/1990 |
| EP | 0 481 609 | 4/1992 |
| FR | 1097275 | 2/1954 |
| FR | 2 317 804 | 2/1977 |
| GB | 529558 | 11/1940 |
| GB | 637286 | 5/1948 |
| GB | 633854 | 12/1949 |
| GB | 661410 | 11/1951 |
| GB | 682877 | 11/1952 |
| GB | 762097 | 11/1956 |
| GB | 762119 | 11/1956 |
| GB | 808991 | 2/1959 |
| GB | 896161 | 5/1962 |
| GB | 962417 | 7/1964 |
| GB | 992288 | 5/1965 |
| GB | 997139 | 7/1965 |
| GB | 1 018963 | 2/1966 |
| GB | 1027259 | 4/1966 |
| GB | 1035656 | 7/1966 |
| GB | 1037664 | 8/1966 |
| GB | 1045812 | 10/1966 |
| GB | 1063257 | 3/1967 |
| GB | 1085434 | 10/1967 |
| GB | 1102267 | 2/1968 |
| GB | 1106511 | 3/1968 |
| GB | 1106923 | 3/1968 |
| GB | 1109052 | 4/1968 |
| GB | 1109158 | 4/1968 |
| GB | 1111791 | 5/1968 |
| GB | 1117181 | 6/1968 |
| GB | 1132103 | 10/1968 |
| GB | 1135530 | 12/1968 |
| GB | 1136243 | 12/1968 |
| GB | 1170020 | 11/1969 |
| GB | 1179229 | 1/1970 |
| GB | 1182726 | 3/1970 |
| GB | 1239756 | 7/1971 |
| GB | 1255542 | 12/1971 |
| GB | 1256885 | 12/1971 |
| GB | 1263248 | 2/1972 |
| GB | 1268290 | 3/1972 |
| GB | 1283905 | 8/1972 |
| GB | 1327564 | 8/1973 |
| GB | 1334230 | 10/1973 |
| GB | 1353588 | 5/1974 |
| GB | 1396280 | 4/1975 |
| GB | 1400446 | 7/1975 |
| GB | 1414920 | 11/1975 |
| GB | 1424195 | 2/1976 |
| GB | 1464477 | 2/1977 |
| GB | 1467286 | 3/1977 |
| GB | 1493391 | 11/1977 |
| GB | 1537278 | 12/1978 |
| GB | 1537279 | 12/1978 |
| GB | 1551746 | 8/1979 |
| GB | 1571884 | 7/1980 |
| GB | 2064138 | 6/1981 |
| GB | 2085523 | 4/1982 |
| GB | 2130751 | 6/1984 |
| WO | 90/15242 | 12/1990 |

OTHER PUBLICATIONS

John W. Sawyer, "Sawyer's Gas Turbine Engineering Handbook", vol. 3, 3rd Edition, 1985, pp. 7-32-7-39.

Hans-Peter Hempel, "Power Semiconductor Handbook", 1980, pp. 11-17 and 103.

EHJ Pallett, "Aircraft Electrical Systems", 1989, pp. 161.

Lucas Aerospace, Overhaul Manual, 1978, pp. 2-3.

Rex M. Davis, "Power Diode and Thyristor Circuits", 1971, pp. 9-11.

"Solid-State Devices Manual", RCA Corporation, Mar. 1975, pp. 150-173 and 448-471.

D.S. Gibbs and I.M. Shaw, "Scorpio Mk.2 Ignition System".

R. Greenwood, "Automotive and Aircraft Electricity", 1969, p. 160-161.

F.E. Gentry, F.W. Gutzwiller, N. Holonyak, Jr., E.E. Von Zastrow, "Semiconductor Controller Rectifiers: Principles and Applications of p-n-p-n Devices", 1964, p. 369-370.

R.W. Burke and C.J. Dunne, "A Transistorized Contactless Low Voltage Ignition System", 1963, pp. 52-56.

H.C. Welch, "Solid-State Ignition", Jun. 1963, pp. 47-51.

Lucas Aerospace, Overhaul Manual Type NB. 9518 & NB. 9568 High Energy Ignition Units, 1979.

M.W. Burgher, "Interrelated Parameters of Gas Turbine Engine Design and Electrical Ignition Systems", 1963, pp. 1-6.

J. Markus, "Modern Electronic Circuits Reference Manual", 1980, p. 764.

"Low Voltage Exciter", Aviation Equipment Maintenance, Dec. 1988.

R. Ramshaw, "Power Electronics Thyristor Controlled Power for Electric Motors", 1973, pp. 23-26.

R.F. Graf, G.J. Whalen, "Solid-State Ignition Systems", 1974, Chapters 1, 3, 5.

General Electric, "SCR Manual Sixth Edition", 1979, p. 141.

F.F. Mazda, "Thyristor Control", 1973, pp. 72-73 and 100-103.

W.B. Larew, "Ignition Systems", 1968, pp. 162-180, 198-202.

Rolls-Royce plc, "The Jet Engine", 1986, pp. 121-131.

Society of Automotive Engineers, Inc., "Capacitor Discharge, Piezo Electric, and Transistorized Spark Ignition Systems", 1965, pp. 9-11.

Lucas Aerospace Ltd., "Complete Electrical & Starting Systems", pp. 3-7, 13-15, 20.

B.J. Min, H.W. Wearsch, "An Improved Snubber Circuit for Power Semicondutors", IAS, 1977, pp. 1017-1022.

General Electric Company, "Thyristors-Rectifiers", 1982, pp. 5, 10-18, 33,43, 55-56, 74-77.

J.J. Tracy, R.B. Bailey, "Ferrites Simplify Snubber Design for a Traction Chopper Utilizing Series Thyristors", 1975, pp. 332-339.

D.A. Paice, P. Wood, "Nonlinear Reactors as Protective Elements for Thyristor Circuits", 1967, pp. 228-232.

J.G. Tracy , P.B. Bailey, "How to Simplify Snubber Design Using Ferrite", 1974.

B.M. Bird, K.G. King, "An Introduction to Power Electronics", 1983, pp. 22-34.

Sen, "Power Electronics", 1987, pp. 60-65.

Eyquem S.A., "Fiche Technique No. 251", 1978.

Turbomeca Etudes, Note Technique No. 2347, 1974.

Ge Thyristor Catalog, 1979, p. 141.

Sescosem, "Rectifiers, Diodes, Thyristors", 1976, pp. 439-459.

K.W. Cattermole, "Transistor Circuits", 1964, pp. 320-329, 458-461, 468-469.

R.W. Anderson, "The Effect of Ignition System Power on Fast Burn Engine Combustion", Jan. 1987.

S. Pischinger, "Effects of Spark Plug Design Parameters on Igntion and Flames Development in an SI-Engine", submitted at the Massachusetts Institute of Technology, Jan. 1989.

Edwards et al., "Comparative Study of Plasma Ignition Systems", SAE Technical Paper Series, SAE The Engineering Resource for Advancing Mobility, International Congress & Exposition, Detroit, MI, Feb. 28-Mar. 4, 1983.

D.S. Gibbs and I.M. Shaw, "Scorpio Mk.2 Ignition Systems", date not available.

Lucas Aerospace Ltd., "Complete Electrical & Starting Systems", pp. 3-7, 13-15, 20, date not available.

$$\frac{dE_1}{dx} = \left[\frac{q}{11.8\varepsilon_0}\right] N_1$$

$$V_{BO} = \frac{1}{2} a_1 E_{maxSi} + a_2 E_2 + \frac{1}{2} E_1 a_2 + \frac{1}{2} E_2 a_3$$

SOLID STATE TURBINE ENGINE IGNITION EXCITER HAVING ELEVATED TEMPERATURE OPERATIONAL CAPABILITY

CROSS REFERENCE TO RELATED APPLICATIONS

Method And Apparatus For Fabricating And Connecting A Semiconductor Power Switching Device, filed Oct. 28, 2004, now U.S. Pat. No. 7,144,792, by John C. Driscoll, Theodore S. Wilmot and Eugene O. Bryan.

BACKGROUND OF THE INVENTION

The present invention generally relates to high voltage power supplies, and more specifically to an improved ignition exciter for turbine engine applications.

Modern turbine engine ignition exciters, especially those used in small gas turbine applications, have evolved considerably in recent years; migrating from spark gap (plasma) switching devices and simple relaxation type oscillator charge pumps to more reliable and predictable solid state switching devices with digitally controlled DC-DC converter charge pumps. Thermal performance of current art solid state ignition exciters has been limited due to available thyristor switching technology. Some designs use multiple series stacked phase control thyristors with saturable reactors, while others employ switching devices specifically designed for pulse power applications. However, performance of both suffer from leakage current related limitations of the switching devices. At elevated temperatures, leakage current within the switching device results in increased power dissipation. This condition precipitates additional leakage current, resulting in a thermal runaway condition and device failure.

The most advanced current art exciters employ pulse type thyristors to eliminate the need for saturable magnetic components in the output stage and the associated limitations of that technology. While a considerable improvement over phase control based designs, thermal performance of current art pulse thyristor based ignition exciters is still limited by switching device leakage current. Moreover, current art technology incorporates costly semiconductor die manufacturing and device packaging techniques limiting commercial viability of the ignition exciters. The ignition exciter embodiments of the present invention exhibit superior reliability and have simplified gate circuitry through the use of a unique low side switching topology.

SUMMARY OF THE INVENTION

The first preferred embodiment of the present invention provides improved turbine engine ignition exciter technology that enables volumetrically efficient, lightweight, and high reliability operation at elevated ambient temperatures. The first preferred embodiment uses a semiconductor pulse switching device that is designed to exhibit low leakage current at elevated ambient temperatures and a low side switching topology that includes a discharge circuit for releasing energy from an energy store to ground whereby negative polarity energy is applied to the igniter. This embodiment uses a gate drive circuit that is specifically tuned for the particular exciter to insure a positive gate drive current in the switching device throughout the stressful modulation period.

The first preferred embodiment also includes circuitry for compensating for low input voltages applied to the exciter, which enables the exciter to reliably operate when low input voltages are experienced.

A second preferred embodiment uses the semiconductor pulse switching device that is designed to exhibit low leakage current at elevated ambient temperatures and a high side switching topology that also uses a gate drive circuit that is specifically tuned for the particular exciter to insure a positive gate drive current in the switching device throughout the stressful modulation period.

DETAILED DESCRIPTION OF THE PREFERRED EMBODIMENTS

Figure 1:
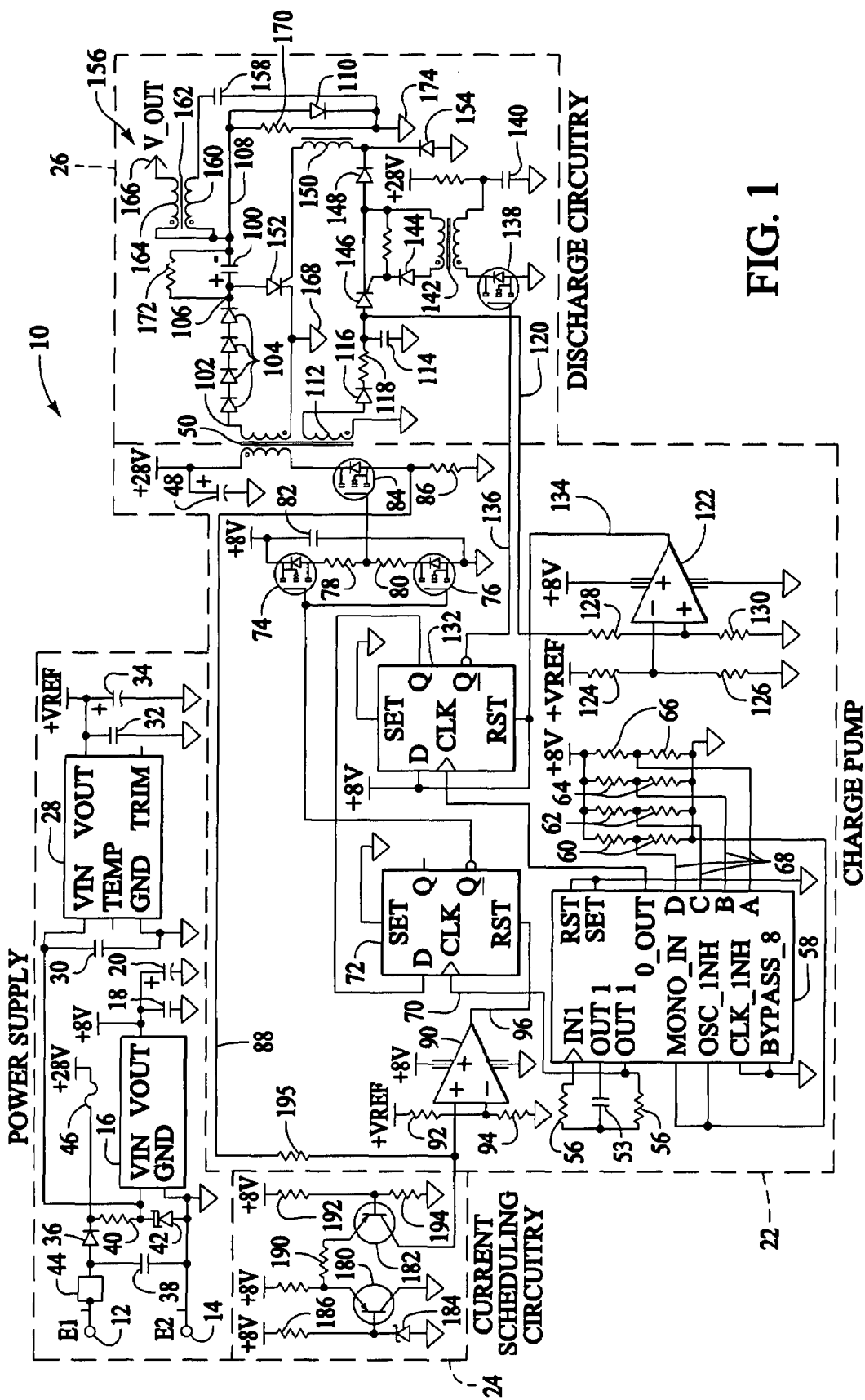
FIG. 1 is an electrical schematic diagram of a preferred embodiment of an ignition exciter assembly according to the present invention, which uses a low side switching topology.

Operation of current prior art turbine engine ignition exciters at elevated ambient temperatures is limited by semiconductor leakage current. At elevated ambient temperatures, semiconductor leakage current increases exponentially with temperature which results in increased switching device power dissipation. This reduces product reliability, and if not carefully accounted for in the design process, can result in system failure due to thermal runaway effects. That is, at extreme temperatures device dissipation causes further device heating, which in turn causes further dissipation which progresses exponentially until the device is destroyed. This condition is exacerbated by the relatively high (approximately 3 kV) exciter tank circuit voltages commonly used in turbine engine ignition systems. The first preferred embodiment of the present invention employs a relatively low (i.e., approximately 1.5 kV to approximately 1.95 kV) tank voltage to further reduce dielectric and leakage current stresses on the switching device.

Another advantage of the first preferred embodiment is the low side switching circuit topology. Solid state turbine engine ignition exciters have traditionally employed high side switching schemes to insure a positive polarity discharge waveform. Positive polarity discharge waveforms are known to erode the negative polarity igniter plug outer shell electrode at a higher rate than the positive polarity inner (center) electrode due to positive ion bombardment. Typically, the igniter plug outer shell electrode is designed to have considerably higher mass than the center electrode to maximize life. While the rate of material erosion is highest on the negative polarity electrode, the rate of igniter plug diametral spark gap growth is not appreciably different between positive and negative polarity systems.

It has been determined that the igniter plug spark gap is on the order of 3% larger at end of life using a negative polarity system on off-the-shelf igniters designed for positive polarity systems. However, off-the-shelf igniters wear out at essentially the same time regardless of ignition system polarity.

By contrast, positive polarity solid state ignition systems suffer a considerable reliability penalty due to the fact the switching device cathode is referenced to a dynamic load. That is, prior to igniter plug ionization, the cathode is essentially floating with respect to circuit ground. This condition makes it difficult to insure a predictable and repeatable switching device gate drive during the stressful device modulation period. The first preferred embodiment of the present invention solves this problem by referencing the switching device cathode to circuit ground. In this topology, the gate drive waveform is highly predictable and repeatable and can be easily controlled with simple and inexpensive circuitry.

The preferred embodiments of the present invention also include novel circuitry to schedule input current allowing reliable operation at low input voltages. Recent trends in turbine engine based aircraft have resulted in lower available input voltage at engine start. Modern small gas turbine ignition exciters typically employ current mode pulse width modulator (PWM) based DC-DC converters to accomplish the capacitor charging function. At very low input voltages, the current mode controller set point value cannot be satisfied, resulting in a continuous current drain. To prevent this condition, the preferred embodiments employ current scheduling circuitry to automatically adjust the PWM set point as a function of input voltage allowing operation at low input voltages.

Turning now to the drawings and particularly FIG. 1, the first preferred embodiment of the ignition exciter circuit is illustrated generally at 10. It will be appreciated by those skilled in the art that the essential discharge circuit elements of the exemplary embodiment can easily be adapted, for example, to ac input power variants and various application specific output voltage, spark rate and energy configurations.

The power supply section is comprised of two individual voltage regulator sections. Both derive power at 12 and 14 from the exciter input power source and subsequent electromagnetic interference filter (both, not illustrated). The first regulator, comprised of integrated circuit 16, capacitors 18 and 20 provides power to the exciter internal circuitry (charge pump circuitry, indicated generally at 22, current scheduling circuitry, indicated generally at 24, and discharge circuitry, indicated generally at 26, establishing the +8V bus. The other regulator, comprised of integrated circuit 28 and capacitors 30, 32 and 34 is a temperature compensated precision voltage reference used to provide a stable reference supply to the charge pump current and voltage mode comparators establishing the Vref bus. The reference supply is designed to insure predictable (spec. compliant) operation of the ignition exciter at extremely low input voltages (for example 8.5 VDC). Other elements within the power supply section include, a reverse polarity protection diode 36; capacitor 38, resistor 40 and transorb 42, EMI suppression and transient input voltage protection elements 44 and fuse 46 primary dc power bus fault protection.

The charge pump section 22 is a current mode flyback topology DC-DC converter. Filtered input power supplied to the charge pump from the input power source and EMI filter (not illustrated) is stored on energy reservoir capacitors 48 in the upper right portion of the charge pump section 22. This capacitor sources current to the primary winding of a flyback transformer 50 through line 52 minimizing current drain on the input power bus during charge pump 22 operation.

Capacitor 53 and resistors 54 and 56 control the center frequency of RC ring oscillator circuitry within integrated circuit 58. Oscillator 58 includes hardware programmable divide-by-N circuitry that divides the high frequency DC-DC chopper frequency down to approximately 1 Hz to approximately 8 Hz rate, thereby establishing the exciter discharge repetition rate. Programming of the repetition rate is accomplished by selectively populating or de-populating jumpers in one of the appropriate resistor pairs 60, 62, 64 or 66, tying the appropriate A-D input controls 68 to a logic high or low condition.

The high frequency (charge pump rate) output from integrated circuit 58, which is preferably on the order of 90 kHz, but which can be higher or lower, is routed via line 70 to flip-flop 72. A totem pole gate drive circuit comprised of transistors 74, 76, resistors 78, 80 and capacitor 82 in turn activates transistor 84 in response to signals provided by flip-flop 72. When activated, transistor 84 initiates current flow from the DC input bus (+28V) through transistor 84 and the current mode sense resistor resistor 86. As current flow linearly ramps up through the transformer primary winding, an analogous voltage is generated on the sense resistor 86 which is applied by line 88 to the positive input of a comparator 90, which operates as a current mode controller with associated reference voltage divider resistors 92 and 94. The comparator 90 resets flip-flop 72 via line 96 when the appropriate input current value is achieved. This in turn terminates the current mode cycle insuring precise control of the transformer 50 energy ($E=LI^2/2$) on a per cycle basis.

The charge pump has two independent outputs. The primary output is the secondary of the flyback transformer 50 which charges the exciter main energy storage (tank) capacitor 100 via line 102 which has four series connected rectifier diodes 104 and node 106 that is connected to the positive terminal of the capacitor 100, with the negative terminal thereof being connected to ground via line 108 and diode 110. A second, tertiary, winding 112 on the flyback transformer 50 similarly charges a tertiary energy storage capacitor 114 through rectifier diode 116, resistor 118 and line 120. As the charge pump operates, charge is incrementally imparted on the tank capacitor 100 and the tertiary capacitor 114, increasing the potential on each capacitor approximately as a function of the transformer secondary-tertiary turns ratio. Therefore, the tertiary tank capacitor 114 circuit forms a low potential mirror of the high potential primary energy storage tank capacitor 100 circuit allowing safe, reliable and indirect monitoring of the high potential circuit.

A voltage mode feedback loop comprised primarily of line 120, comparator 122, associated reference divider resistors 124 and 126 and feedback resistor divider 128 and 130 monitors the tertiary tank capacitor 114 to determine when both capacitors have reached full charge. When the tertiary tank capacitor 114 voltage feedback signal reaches the set point value, comparator 122 resets flip-flop 132 via line 134. This prevents transmission of high frequency (charge pump rate) flip-flop 72 drive signal to the switching transistor 84; deactivating the high frequency charge pump operation. Likewise, this condition causes flip flop 132 to simultaneously transmit a trigger signal via line 136 to transistor 138 in the discharge circuit 26.

The trigger signal from flip flop 132 on line 136 activates switching transistor 138 allowing charge stored in a trigger tank capacitor 140 to discharge to ground through a trigger transformer 142. This activity in turn generates a trigger pulse through diode 144 which activates the gate drive of thyristor 146. The thyristor 146 then conducts charge stored in the tertiary tank capacitor 114 which preferably has a capacity of 30 mJ, so that a current of on the order of 35 amperes may flow through rectifier diode 148, inductor 150 into the gate-cathode junction of a PSD (Pulse Switching Device) 152. The gate drive circuit comprised of rectifier diode 148, inductor 150 and a rectifier diode 154 is specifically tuned for the particular exciter to insure a positive PSD gate drive current throughout the stressful PSD modulation period. Specifically, inductor 150 is tuned to account for differences in the exciter stored energy (tank capacitor 100 value) and resonant frequency of an output pulse forming network indicated generally at 156 to prevent zero, or negative bias on the PSD 152 gate terminal improving PSD reliability and performance. The negative polarity PSD circuit topology and associated gate drive circuitry significantly reduces dielectric stress on the gate drive circuitry since the circuitry is referenced to ground and does not modulate from ground potential to the exciter tank voltage during discharge.

Rectifier diode 154 is a commutating diode which allows recirculation of gate drive current increasing the duration of the gate drive waveform. Again, the exemplary circuit embodiment highlights the novel low side PSD switching topology. That is, as opposed to traditional "industry standard" solid state ignition exciters, the improved circuit topology of the first preferred embodiment references the PSD 152 gate-cathode junction to circuit ground rather than the dynamic floating output load.

Figure 2:
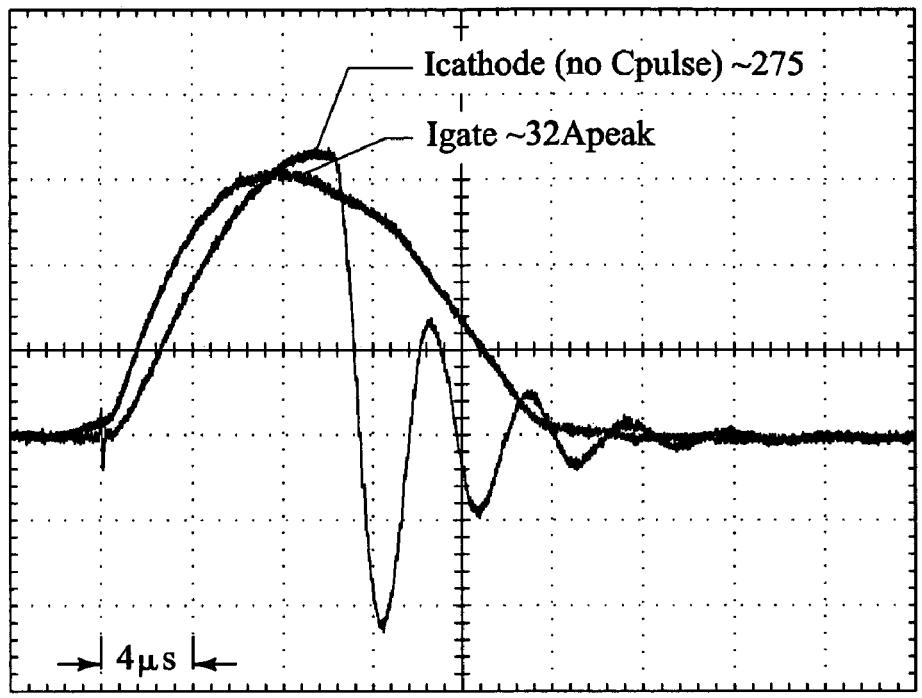
FIG. 2 shows a gate drive waveform of a semiconductor pulse switching device (PSD) of the type used in the first preferred embodiment, as controlled by the tuned gate drive circuit WRT cathode waveform without a pulse capacitor in circuit.
Figure 3:
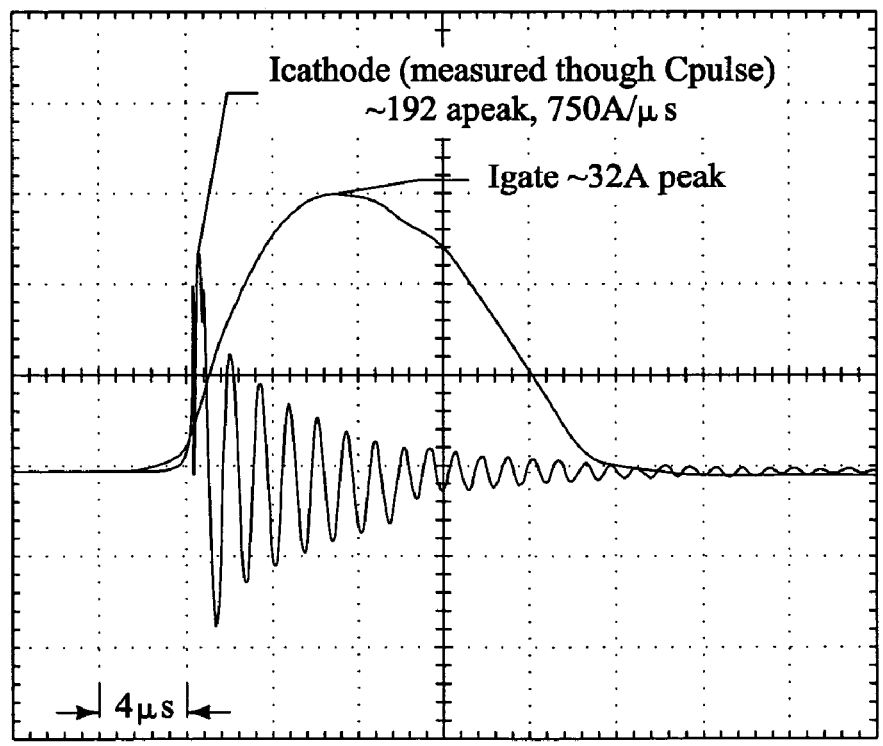
FIG. 3 shows a PSD gate drive waveform of a semiconductor pulse switching device (PSD) of the type used in the preferred embodiments as controlled by the gate drive circuit WRT pulse capacitor induced PSD current.
Figure 4:
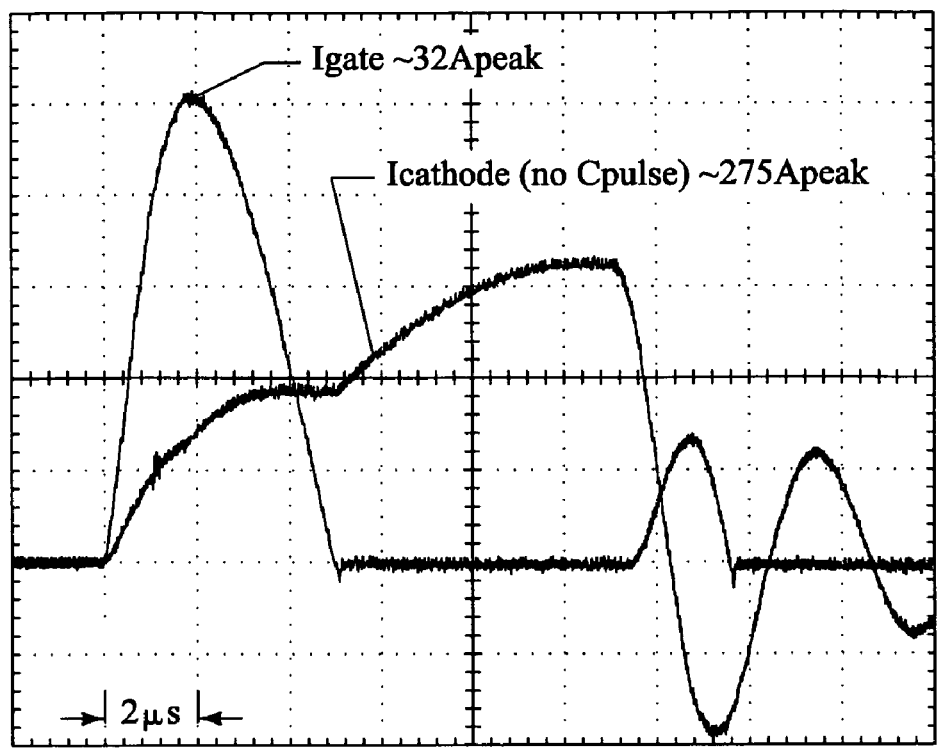
FIG. 4 shows a PSD gate drive waveform WRT cathode waveform without a pulse capacitor in circuit and without a gate drive tuning network in circuit.

FIGS. 2 and 3 illustrate the benefit of the PSD gate drive network. By properly tuning the network, positive PSD gate drive is assured throughout the PSD modulation period. FIG. 2 illustrates a typical PSD gate drive current waveform versus associated PSD cathode current with respect to time without a pulse capacitor connected (no high di/dt content). FIG. 3 illustrates a typical PSD gate drive current waveform versus associated PSD cathode current with respect to time with a pulse capacitor included in the circuit. In both cases, the PSD has positive gate drive during the cathode conduction period. By contrast, FIG. 4 shows a typical PSD gate drive waveform without the associated gate drive network (diodes 148, 154 and inductor 150) included. In the latter case, the gate drive current waveform has higher amplitude, but considerably shorter duration. Due to the pulse nature of the circuit, the PSD does not have adequate time to properly latch and in fact is prevented from properly latching during the stressful high di/dt phase associated with the pulse network and consequently prone to premature failure due to gate current starvation and associated high power dissipation.

Referring again to FIG. 1, when the PSD 152 is activated, a high amplitude high (di/dt) rate current is induced in the output pulse forming network 156 primary circuit elements comprised of the pulse capacitor 158 (approximately 0.05 microFarad) and a pulse transformer primary winding 160 of a transformer 162 having a secondary winding 164. The resonant tank circuit formed by capacitor 158 and transformer primary winding 160 induces a high tension damped sinusoidal waveform on the secondary winding 164 of pulse transformer 162 which is superimposed on the primary energy storage (tank) capacitor 100 potential creating a high potential output waveform to accomplish ionization of the igniter plug (not shown, but connected between Vout 166 and ground).

When the PSD 152 is switched on, the energy stored in the tank capacitor 100 induces a high di/dt current from ground 174 through capacitor 158, pulse transformer primary winding 160 to the negative side of the tank capacitor 100. The high di/dt negative polarity current creates a high frequency high amplitude oscillation in the secondary winding 164 for application to the spark plug gap. The L-C tank circuit comprised of the pulse transformer primary winding 160 and the pulse capacitor 158 controls the resonant frequency of the oscillation. The high amplitude oscillation is superimposed on the exciter tank capacitor voltage resulting in a high potential, high frequency waveform suitable to ionize the igniter plug spark gap allowing release of energy stored in the exciter tank circuit.

The energy release can result in current of as much as 1500 amps flowing through the primary winding 160 of the pulse transformer, which is transformed to a level of approximately 15 kV to approximately 18 kV in the secondary winding 164 which is fed to the plug spark gap. When the igniter plug spark gap is ionized, a low impedance path is created between the igniter plug spark gap, the pulse transformer secondary winding 164, line 108, the tank capacitor 100, the node 106, the PSD 152 anode-cathode junction and circuit ground 168, allowing release of energy stored in tank capacitor 100 into the igniter plug spark plasma. Inductance of the pulse transformer secondary winding 164 controls the discharge rate and peak amplitude of the discharge waveform. A resistor 170 provides a load to absorb exciter discharge energy in the event of a quenched (open circuited) igniter. A resistor 172 bleeds charge off tank capacitor 100 to insure safe working voltages are present during product service.

Another feature of the first preferred embodiment of the present invention is a novel current mode scheduling circuit. Referring to FIG. 1, the circuitry contained in the Current Scheduling Circuitry block 24 reduces the current mode controller set point in response to abnormally low input voltages. Unlike current art solutions directed toward deactivation of the exciter circuitry when input voltage falls below a prescribed threshold level, the current scheduling circuitry enables exciter operation at input voltages significantly below normally specified input voltages, for example 6V. The superior leakage current performance of the PSD switching device 152 enables such a solution. That is, current art ignition exciters are constrained by leakage currents at elevated temperatures. Consequently, current and past prior art ignition exciters intentionally charge the tank capacitor at the highest practical rate to minimize the chance of thermal runaway. By contrast, PSD based exciters can reliably operate with considerably longer capacitor charge times at elevated temperatures. This allows introduction of a number of design features including smaller/lighter and lower cost EMI filters, charge pumps and input current scheduling circuitry to allow operation at extremely low input voltages.

Functionally, the current scheduling circuit adjusts the charge pump peak current set point of comparator 90 as a function of internal 8-volt bus voltage. As input voltage is reduced, the 8-volt regulator 16 drops out of regulation causing the 8V bus to droop. When the 8V bus is operating normally, the current scheduling circuit comprised of transistors 180 and 182, Zener diode 184, resistors 186, 188, 190, 192, and 194, allows Zener diode 184 to conduct, holding the base of transistor 180, for example, at 3.9 volts. Transistor 180, operating in effect as a voltage follower, has an emitter voltage approximately 0.7 volts higher than its base voltage (or about 4.6 volts). Voltage divider 192/194 holds the base of transistor 182 at, for example, about 4.38 volts providing a base to emitter voltage for transistor 182 of about 0.22 volts preventing transistor 182 from conducting. There is no effect on the peak charge pump current for this condition. As the 8-volt bus drops out of regulation, transistor 182 begins to conduct because its base voltage is derived from the 8-volt supply and the emitter voltage of 180 is held relatively constant by Zener diode 184. The collector current of transistor 182 develops a voltage across resistor 195 adding to the actual current feedback voltage. This provides an "apparently" higher feedback voltage to the current mode comparator 90 forcing it to shut-off the transistor 84 at a lower peak current. As the 8-volt output continues to drop, transistor 182 collector current increases further reducing charge pump peak current. As the 8-volt supply continues to fall, the voltage available to the circuit can't sustain transistor 182 collector current and the peak current setting will increase again. Through careful design, the charge pump will stop operating gracefully at an input voltage level incapable of providing adequate gate drive to the primary switching transistor 84.

It will be appreciated by those skilled in the art, one can easily modify the circuit "characteristics", gains and levels, by changing component values. The voltage at which the circuit begins to reduce the peak current is set by the 192/194 voltage divider and the Zener diode 184, i.e., as the divider voltage approaches and becomes lower than the Zener diode 184 breakdown voltage, the circuit begins to supply current to 195, reducing peak current. Resistor 190 provides a convenient adjustment for gain (current reduction/supply voltage drop). Gain increases as the value of resistor 190 decreases.

Figure 5:
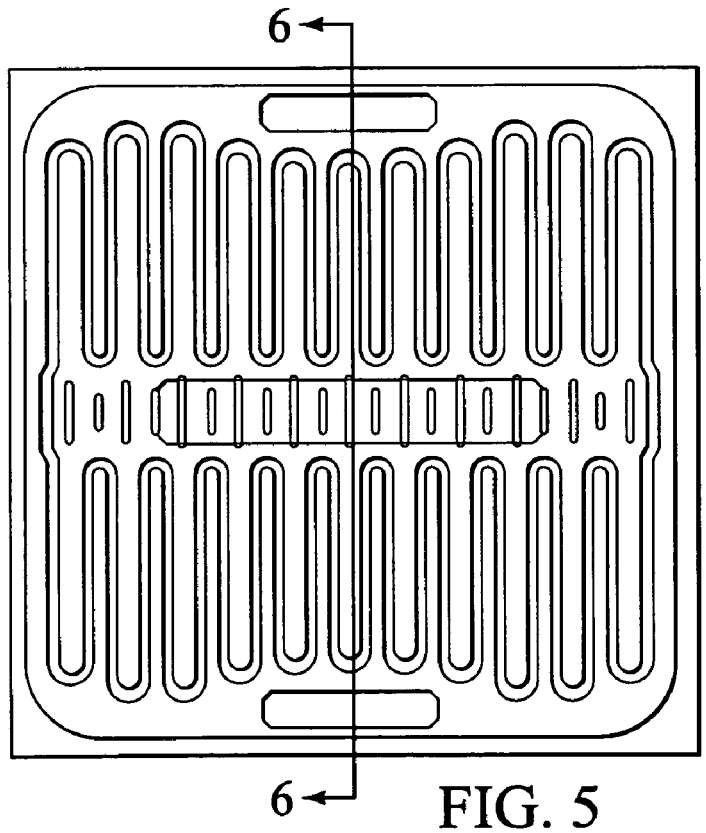
FIG. 5 illustrates the PSD die configurations and gate-cathode metalization geometry.

Referring to FIG. 5, an exemplary PSD switching device gate-cathode metal pattern is illustrated. The highly interdigitated gate-cathode structure of this thyristor type device allows direct switching of high di/dt current pulses without the need for protective (saturable reactor) networks. The compact die footprint (preferably approximately 0.38 inches square) and thin base geometry improves switching speed by approximately 40% compared to competitive (approximately 0.5" diameter) pulse thyristor devices having a circular configuration.

Figure 6:
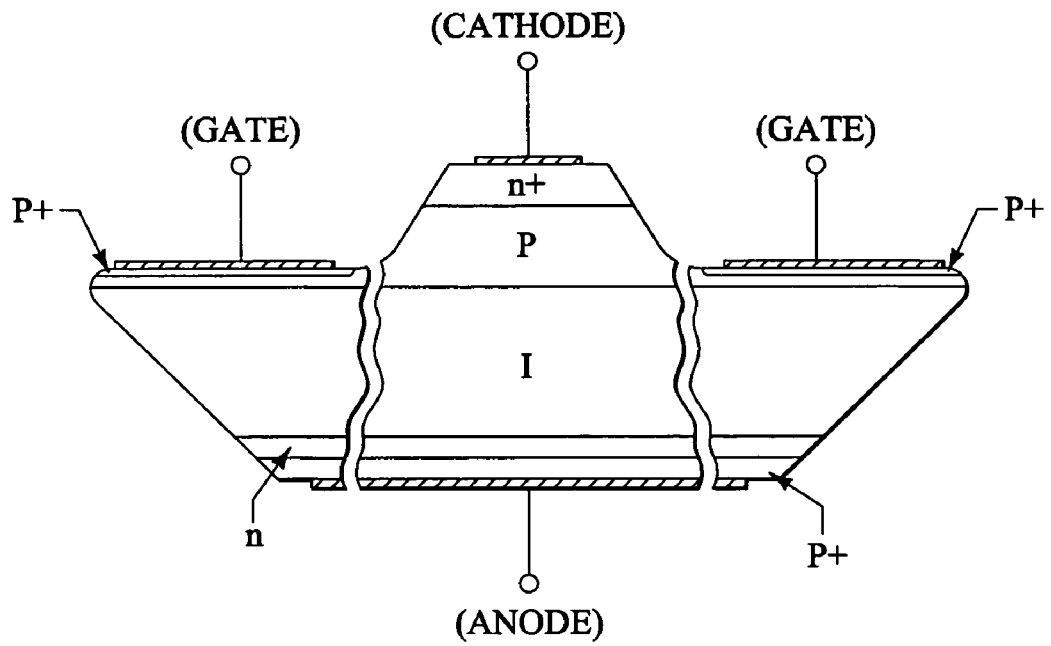
FIG. 6 shows a cross sectional view with the width compressed and taken generally along the line 6-6 of FIG. 5 emphasizing the highly intrinsic/semi-insulating layer and bevel geometry.

FIG. 6 illustrates a cross section of the PSD switching device, with portions removed, wherein the thickness of the structure is preferably only about 0.024 inches, with the (I) region approximately 0.018 inches. The high resistivity to semi-insulating intrinsic region (I) reduces thermally generated carriers and corresponding leakage current at high ambient temperatures enabling improved ignition exciter performance at elevated ambient temperatures. The thin (approximately 0.020" thick) base width reduces forward voltage conduction losses approximately 35% relative to current prior art (0.040" thick) devices. Similarly, bulk related leakage current is reduced an order of magnitude relative to competitive 0.040" thick (symmetric) structures.

The high resistivity intrinsic region allows the PSD device to reliably block high voltages with a narrow base width relative to traditional thyristor structures. The narrow (approximately 0.020" thick) base structure and small (0.38"× 0.38") die size minimizes bulk and surface leakage currents while reducing device forward drop (conduction losses) and modulation time (switching losses) relative to current art technology. Measurements of PSD performance relative to current prior art technology confirm modulation rate is increased approximately 40%, while device forward conduction losses are reduced by approximately 35% and bulk leakage currents to approximately 10% of those associated with traditional high voltage thyristors. These benefits reduce device losses, improving circuit efficiency. Likewise, the improved efficiency results in lower device heating resulting in improved high temperature performance. Moreover, the improved modulation rate allows simplification and miniaturization of the exciter pulse forming network due to improved magnetic coupling associated with the faster switching rate.

Figure 7:
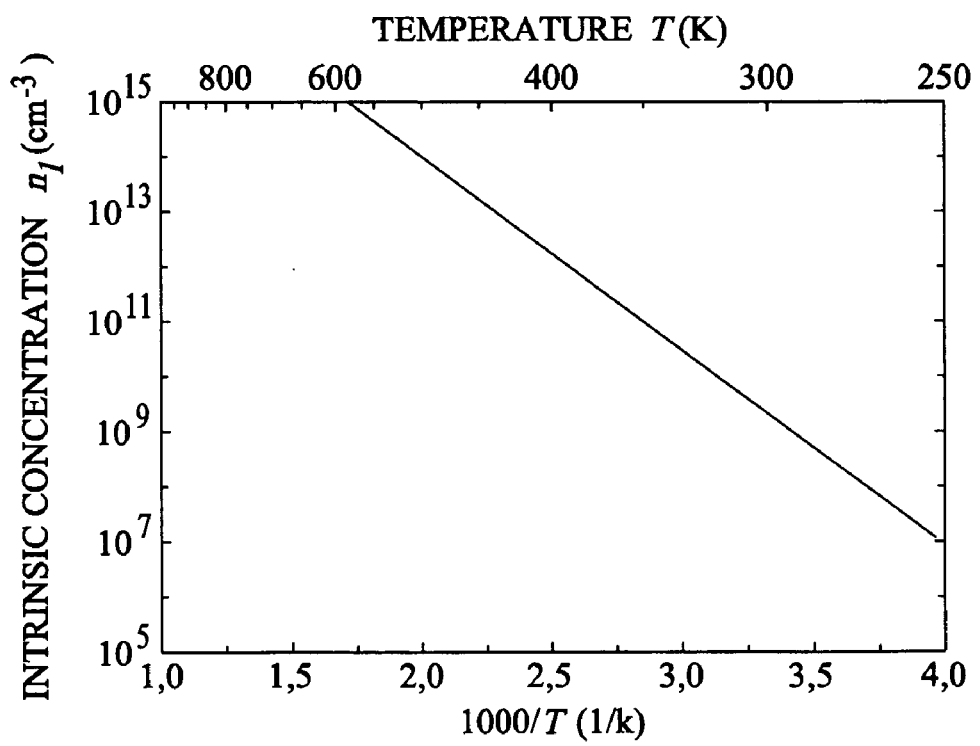
FIG. 7 is a graph showing intrinsic carrier concentration in a silicon semiconductor as a function of temperature.

The familiar Boltzmann factor of Equation 1 describes the effects of ambient temperature on intrinsic carrier concentration within a semiconductor. The highly intrinsic/semi-insulating layer reduces the total number of available carrier sites (Ns); reducing intrinsic carrier concentration relative to temperature. Exemplary PSD devices of the type described above exhibit leakage currents that are at least an order of magnitude lower than the best current art pulse thyristor technology enabling reliable operation at high ambient temperatures, for example up to approximately 175° C. FIG. 7 graphically illustrates the effect of ambient temperature on intrinsic carrier population in silicon.

$$n_i = N_s e^{(-Eg/2k_BT)} \tag{Eq. 1.}$$

Where, $n_i$=the intrinsic carrier concentration $N_s$=the number per unit volume of effectively available states; on the order of $10^9$/cc at 25° C.

Eg=the material energy gap (Si=1.17−(4.73·10$^{-4}$·T$^2$/(T+ 636)) eV) NOTE: 1 eV=1.6022×10$^{-19}$ J $k_B$=Boltzmann's constant (1.381×10$^{-23}$ J/° K)

T=the absolute temperature in Kelvin

Figure 8:
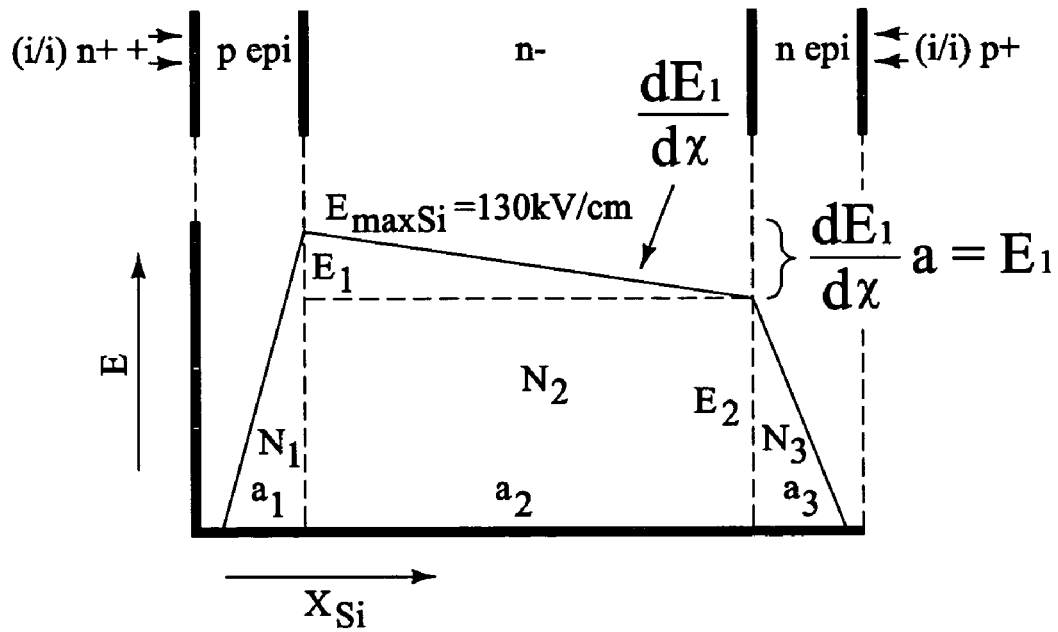
FIG. 8 is an exemplary electric field profile for a current prior art pulse type thyristor.
Figure 9:
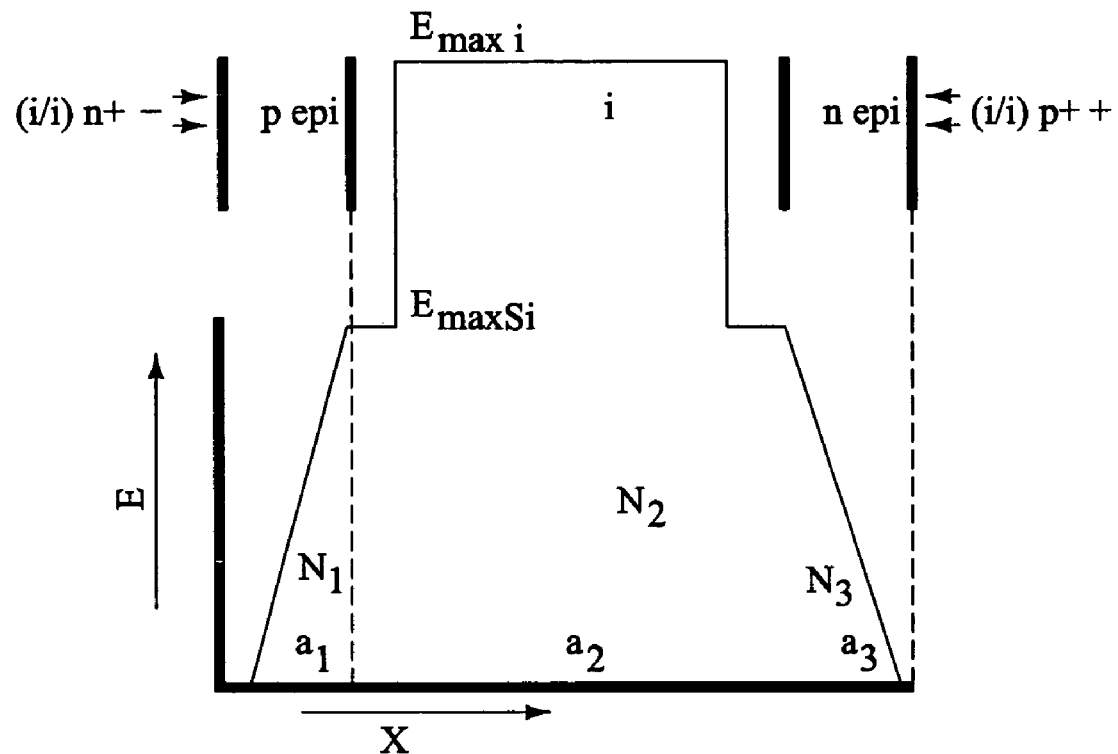
FIG. 9 is an electric field profile for the semiconductor pulse switching device (PSD) of the type used in the preferred embodiments.

By decreasing carrier concentration in the intrinsic layer; transitioning between standard doping levels to, for example, highly intrinsic or semi-insulating levels, increased blocking voltage can be achieved for a given base width. FIGS. 8 and 9 show the relationship between carrier concentration and blocking voltage. Using simple breakdown calculations where the breakdown voltage is approximated by calculating the area underneath the electric field line, FIG. 8 depicts current art n+pn–np++ structure where the peak electric field is 130 kV/cm severely limiting device breakdown voltage (the area under the E vs. x curve) and necessitating an inefficient wide base structure. By contrast, FIG. 9 depicts an exemplary PSD type device using an approximately 10 times higher dielectric breakdown material enabling a device potentially 10% of the thickness of a comparable breakdown voltage current art device. By employing the highly resistive or semi-insulating intrinsic layer, PSD switching speed, forward conduction losses and leakage current are all improved over current art technology.

The first preferred embodiment of the present invention uses an intermediate tank circuit potential of approximately 1.8 kV to further improve exciter performance and reliability at elevated ambient temperatures. Industry standard current art aviation ignition exciter designs typically employ 2.5-3.5 kV tank voltages. By reducing the blocking voltage requirements of the switching device, leakage current is further reduced at elevated ambient temperatures. The reduced exciter tank voltage requires fewer high voltage components, less insulation material and smaller physical flash & creep clearances; reducing unit weight, volume, and cost.

Figure 10:
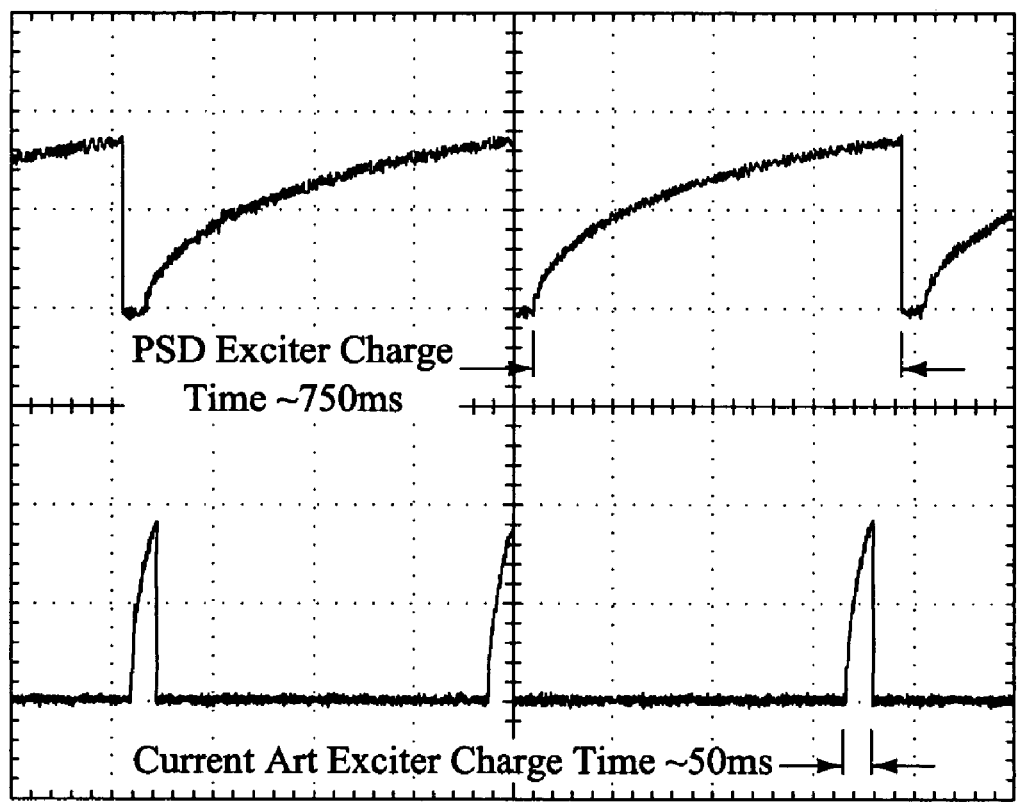
FIG. 10 illustrates exciter capacitor charge waveforms versus time for prior art exciters and for the preferred embodiments of the present invention exciter.

Another key improvement enabled by PSD technology is simplification of the exciter EMI filter and charge pump (DC-DC converter) circuitry. Current prior art solid state ignition exciters are severely limited by switching device leakage current and junction temperature capability. Consequently, current prior art exciters employ large, bulky EMI filters and charge pump circuits to minimize tank capacitor charge time. That is, by minimizing the time the switching device is exposed to stressful high voltage blocking condition; particularly at high ambient temperatures, the exciter is capable of operating at high ambient temperatures. By contrast, due to the exceptionally low PSD leakage current at elevated temperatures and high junction temperature capability, the exciter capacitor charge time is less critical allowing miniaturization and simplification of the EMI filter and charge pump circuitry. FIG. 10 shows an oscillogram of a PSD based ignition exciter tank capacitor charge profile versus that of a typical solid state ignition exciter. The low PSD leakage current (on the order of 200 µA at approximately 135° C.) allows operation at high ambient temperatures without threat of thermal runaway. By contrast traditional thyristors with leakage currents on the order of 5 mA at approximately 135° C. require the use of more aggressive capacitor charge pump technology to prevent thermal runaway at high operating temperatures. For example, a typical 3.0 J (stored energy), 1 Hz rate exciter requires a power supply capable of delivering 66.7 W to achieve a 45 ms capacitor charge time. By contrast, the same exciter requires only a 3.0 W power supply operating as a relaxation oscillator. The low peak input current associated with such a "continuous" charge cycle dramatically simplifies exciter charge pump and EMI filter design while reducing exciter cost, weight and volume.

Figure 1A:
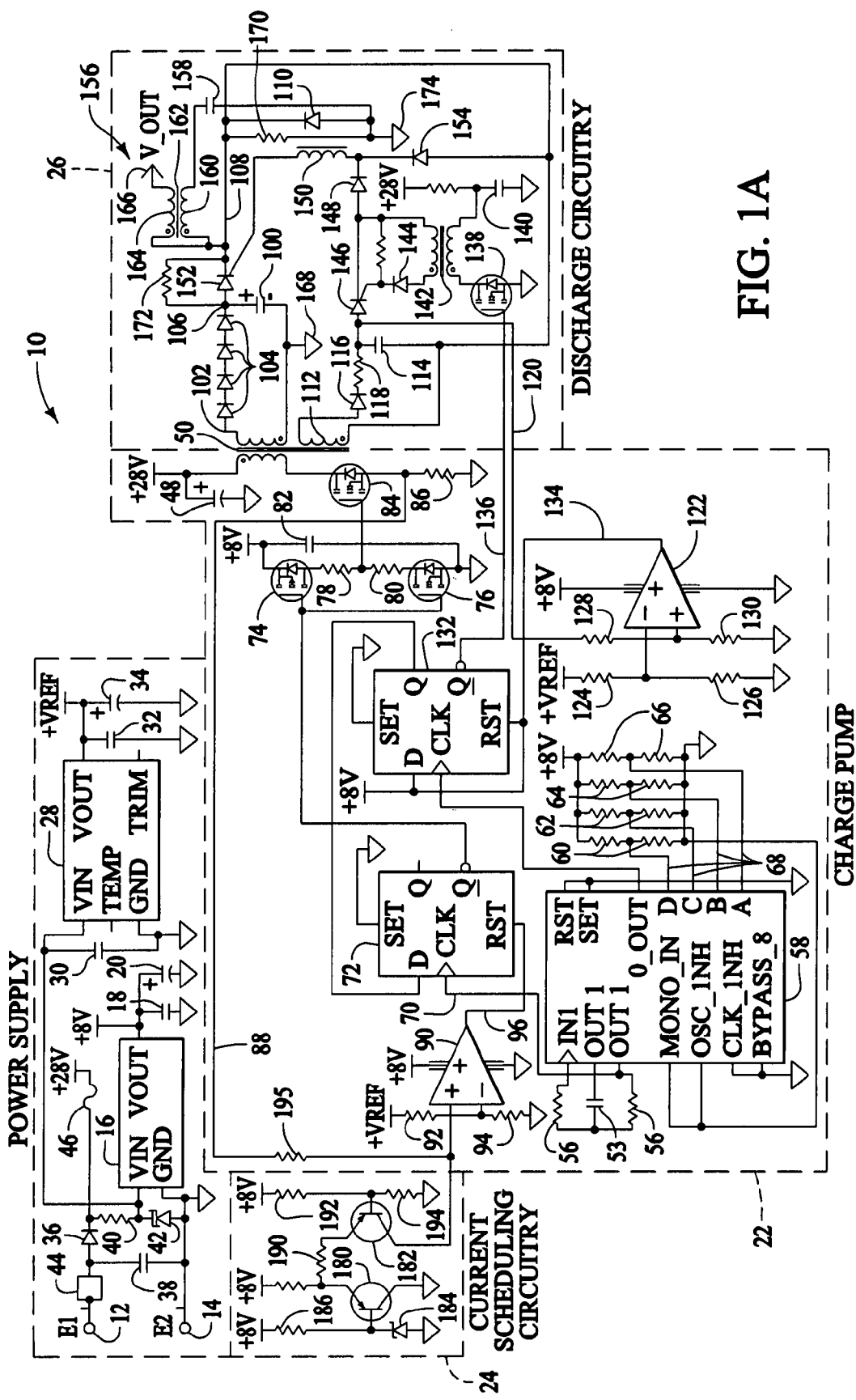
FIG. 1A is an electrical schematic diagram of a second preferred embodiment of an ignition exciter assembly according to the present invention, which uses a high side switching topology.

While the first preferred embodiment that has been described with regard to FIG. 1 has a low side topology, a second preferred embodiment having a high side topology is shown in FIG. 1A. In this embodiment, the capacitor 100 and PSD 152 are reversed relative to their positions in FIG. 1 which results in the capacitor 100 discharging positive voltage into the pulse transformer 162. Also, the tertiary winding 112 is not connected to ground but to capacitor 114 and line 108 and the direction of diode 110 is reversed.

Figure 1B:
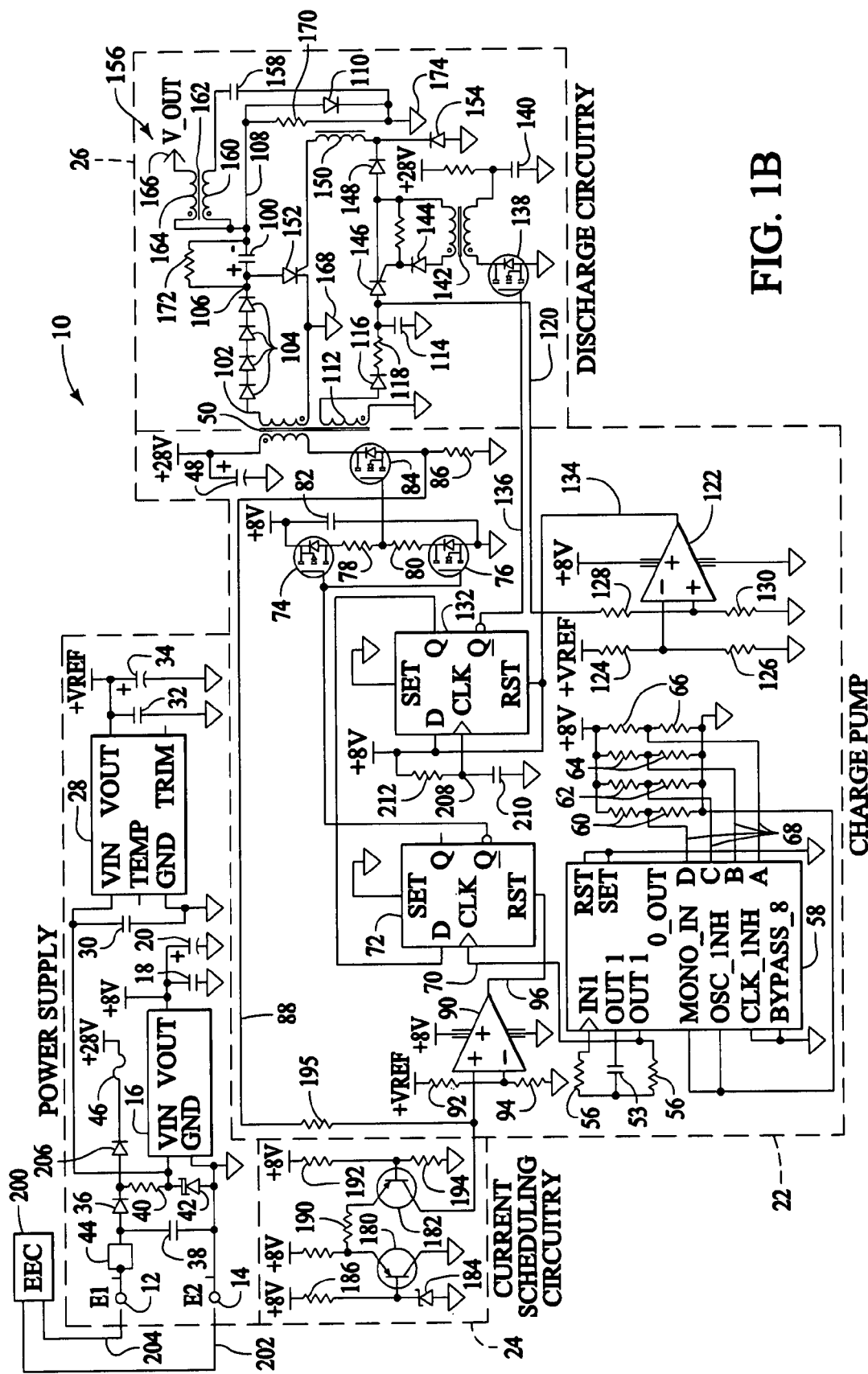
FIG. 1B is an electrical schematic diagram of a third preferred embodiment of an ignition exciter assembly according to the present invention, illustrating an embodiment that is particularly useful when operated in conjunction with a electronic engine controller (EEC).

A third preferred embodiment is shown in the electrical circuit schematic diagram of FIG. 1B, which is very similar to the circuitry of the first preferred embodiment shown in FIG. 1, but is modified to operate together with an electronic engine controller (EEC) 200 that is frequently used to control aircraft turbine engines. A similar type of controller is also known in the art as FADEC controllers which is an acronym for a Full Authority Digital Engine Control. Such controllers are used to monitor a variety of parameters that are used to control the operation of aircraft engines as well as other systems of the aircraft as will be discussed.

Existing FADEC's and EEC's are known to control the spark rate, but it is done by control lines to the exciter circuit rather than the power lines that are used to power the exciter circuit. Because of the potential of lightning strikes and other electromagnetic interference, it has been necessary to employ extensive EMI filters and the like on the front end to protect all of the signal lines that are used to control the exciter circuit.

In prior art EEC controlled ignition systems, the exciter circuitry was typically connected to the aircraft power bus 100% of the time. Exciter activation and deactivation was then accomplished by providing logic level input signals to the exciter. In this arrangement, the exciter input connector must contain a relatively high number of pins to facilitate input from each EEC channel. It has been typical that the EEC generally contain two redundant channels that must be capable of independently driving either exciter which necessitates a high number of input pins to allow redundant control of each ignition channel by the two EEC channels. The high pin count connector is generally more costly relative to a low pin count connector.

In this preferred embodiment, the EEC controls the spark rate that is generated by the exciter circuit merely by selectively applying and terminating power to the exciter circuit via lines 202 and 204 which are connected to respective inputs 12 and 14. A diode 206 is provided at the output of a first portion of the power supply that provides a 28 volt source to the capacitor 48 and primary winding of the transformer 50. The diode 206 is intended to block reverse current flow when power has been terminated which would otherwise flow from the capacitor 48 and primary winding of the transformer 50 in the reverse direction. Since the charge pump circuitry 22 consists of integrated circuits and logic chips as well as switching transistors that are supplied by the 8 volt output bus from the regulator 16, when power is terminated by the EEC 200, this charge pump circuitry will be disabled. The internal circuitry of the charge pump 22 is also modified so that the zero output of the integrated circuit 58 does not clock the flip-flop 132. Rather, the clock input is supplied by a signal on clock line 208 that is connected to ground through a capacitor 210 and to the 8 volt power supply through resistor 212. The components 208, 210 and 212 define a one-shot multivibrator.

When the voltage on the input power bus on inputs 12 and 14 is interrupted, the substantial charge on capacitor 48 will tend to move back to the voltage regulator 16 were it not for the diode 206 which blocks that reverse flow. In this manner, the 8 volt and VREF regulators 16 and 28 will decay very quickly and when they do decay, the flip-flop 72, one-shot multivibrator 132 as well as comparator 90 will go dead which effectively resets these components. Since the output from chip 58 that was used in the embodiments of FIGS. 1 and 1A is no longer being used, the new one-shot 132 type of operation will cause the one-shot to be clocked when the capacitor 210 is charged upon resumption of input power to the input power bus 12 and 14. The integrating circuit comprised of resistor 212 and capacitor 210 preferably has a relatively small RC time constant, e.g., about 1 millisecond, with respect to the anticipated capacitor 210 charge time interval which is approximately 60 milliseconds so that a charge/discharge sequence is initiated and then prevented until power is terminated and reapplied by the EEC. The EEC 200 thereby controls the power input bus voltage and can modulate the frequency of the output pulse of the igniter between the range of about 1 Hz to about 6 Hz. This modulation is effectively and desirably controlled by the EEC 200 because it receives other kinds of operating characteristic parameters concerning the engine. An advantage is that the spark rate of the exciter circuit is controlled only by the selective application and termination of power to the circuit rather than other control lines which would have to be protected from lighting and other EMI conditions.

This embodiment enables improves turbine engine ignition flexibility by allowing the EEC to periodically pulse the exciter when sparks are required. By allowing the EEC to control the exciter, the system is more elegant than prior/current art systems that blindly generate sparks until power is removed. This feature improves effective igniter plug-wear and reduces stress on the exciter surface circuit and the aircraft electrical system. It also allows for more sophisticated system integration in that since the EEC already receives and processes a variety of environmental and electrical as well as physical measurements and subsequently controls a variety of engine parameters, it is ideally suited to evaluate engine parameters and command ignition as required. For example, the EEC can command a higher spark rate during cold, or altitude relight regimes while protecting the exciter when the input voltage droops or the ambient temperature is too high. In the latter case, the EEC would preferably contain a map of allowable safe operating conditions and adjust the spark rate accordingly to protect the exciter circuit.

Figure 1C:
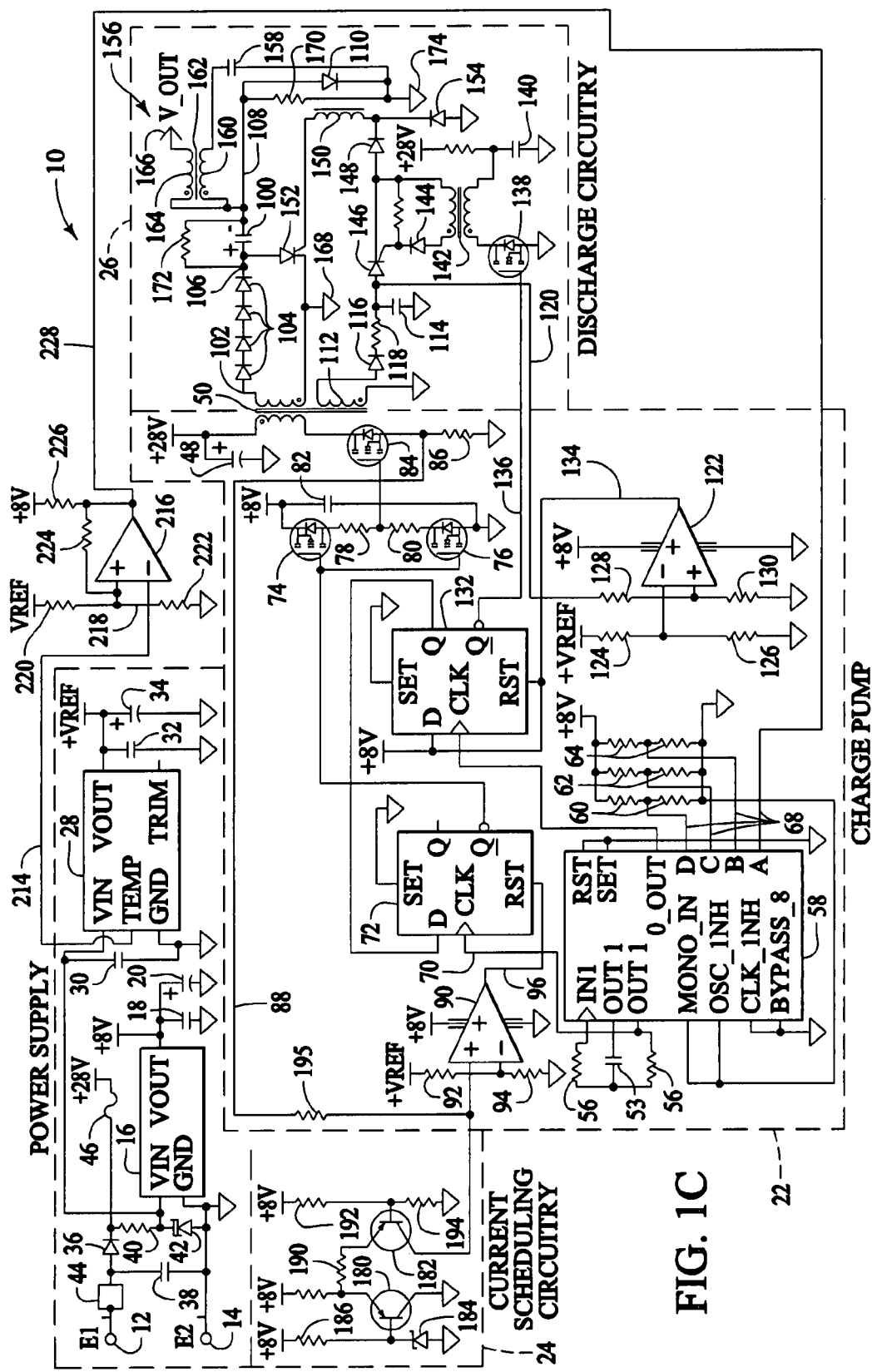
FIG. 1C is an electrical schematic diagram of a third preferred embodiment of an ignition exciter assembly according to the present invention, illustrating an embodiment that can digitally change the spark rate that is generated by the exciter assembly as a function of temperature.

A fourth preferred embodiment is shown in FIG. 1C which is similar to FIG. 1, with the exception of the configuration of the resistor network 60, 62, 64 and 66 that are associated with the A, B, C and D inputs of the oscillator chip 58 of the charge pump 22. In this configuration, the 0_OUT line of the chip 58 is connected to clock the flip-flop 132 in the manner as described with respect to FIG. 1. As previously mentioned, the voltage regulator is a temperature compensated precision voltage reference that is used to provide a stable reference supply to the charge pump current and voltage mode comparators establish the VREF bus. This chip has a temperature output line 214 that is a voltage that is proportional to the ambient temperature of the chip 28. That signal on line 214 is applied to one input of the comparator 216, the other input of which is provided by line 218 that has voltage divider resistors 220 and 222. Line 218 is also connected to resistor 224 which in turn is connected to the 8V bus via resistor 226 and to an output line 228 that extends to the A input pin of the chip 58.

The regulator 28 temperature output preferably has a positive temperature coefficient, delivering approximately 9.6 millivolts per ° C. above a baseline threshold. As the exciter internal temperature reaches a predetermined threshold, the comparator circuit pulls the output line 228 low which changes the divide-by-n value and effectively divides the exciter spark rate in half. The resistor 224 provides hysteresis which prevents oscillations around the set point temperature. In practice, the hysteresis may result in an approximately 10 to approximately 20° C. deadband to prevent oscillation of the spark rate between the low and high repetition rates. The resistor 226 is a pull-up resistor required to force a logic 1 on pin A of the oscillator 58 until the comparator output pulls the pin low. In this manner, discrete changes in the spark rate control can be achieved. It should be understood that multistage digital versions could be employed by adding other comparators in a manner that is well known to those of ordinary skill in the art which would divide the spark rate by 2 and then by 2 again which could result in output rates of 1, 2 or 4 Hz.

Figure 1D:
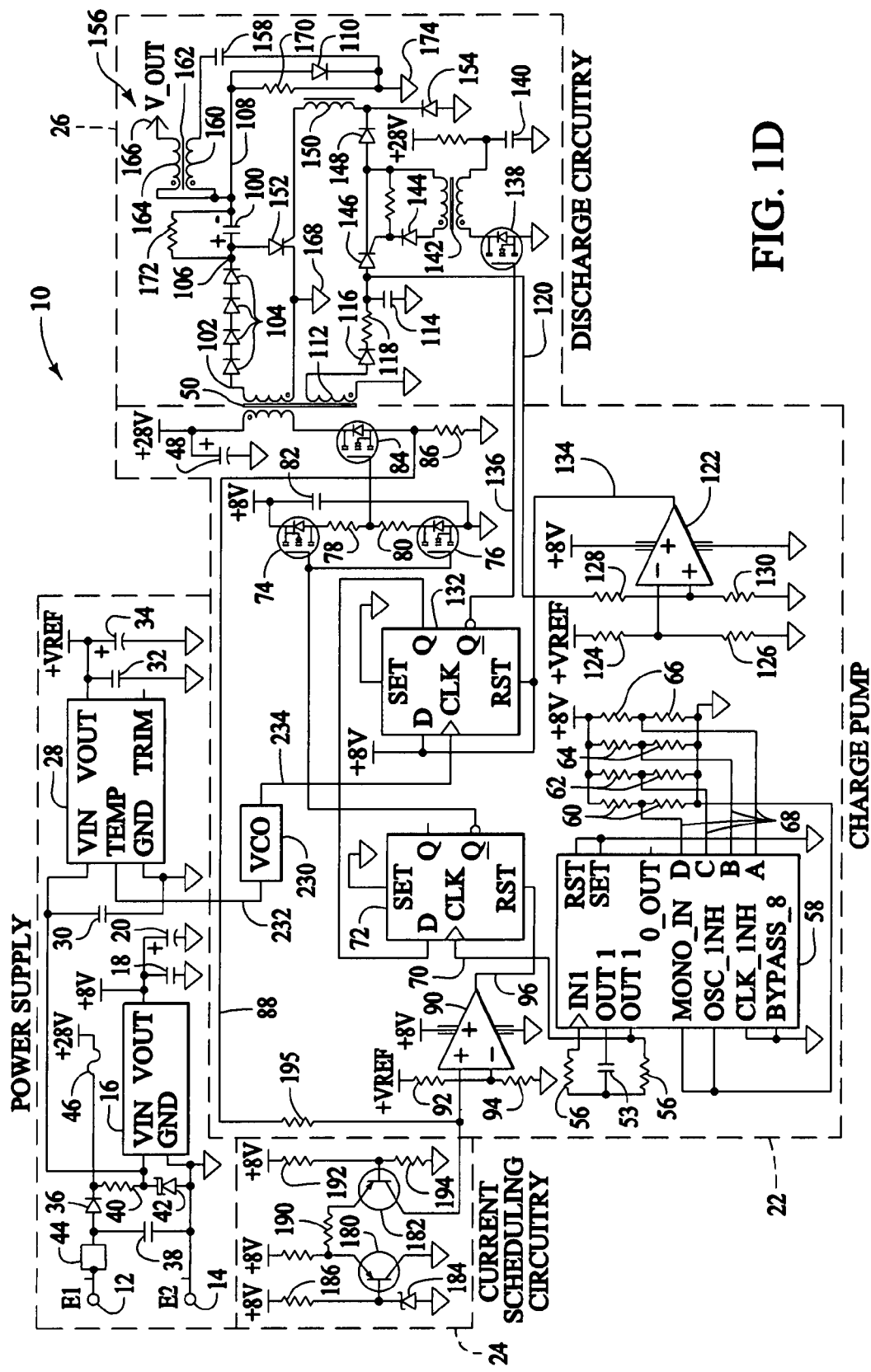
FIG. 1D is an electrical schematic diagram of a third preferred embodiment of an ignition exciter assembly according to the present invention, illustrating an analog circuit embodiment that can change the spark rate that is generated by the exciter assembly as a function of temperature.

Referring to FIG. 1D, an analog version of circuitry which adjusts the spark rate of the igniter is shown. In this embodiment, the temperature output of the regulator 28 is connected to a voltage controlled oscillator 230 via lines 232 and the output of the VCO 230 is applied on line 234 to clock the flip-flop 132. In this embodiment it is apparent that the 0_OUT output pin of the chip 58 is not used to clock the flip-flop 132. The VCO oscillator frequency range is preferably tuned to reduce the spark rate as the ambient temperature increases.

While the embodiments shown in FIGS. 1B, 1C and 1D are modifications of the FIG. 1 circuitry, it should be understood that the same modifications can be made to the preferred embodiment shown in FIG. 1A inasmuch as the modifications of FIGS. 1B, C and D relate to the circuitry which is common to both of the first and second preferred embodiments shown in FIGS. 1 and 1A.

While the PSD is described herein in sufficient detail to support the invention as claimed, applicants hereby incorporate by reference the following related applications: Apparatus For Fabricating And Connecting A Semiconductor Power Switching Device, filed Oct. 28, 2004, now U.S. Pat. No. 7,144,796, by John C. Driscoll, Theodore S. Wilmot and Eugene O. Bryan.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the following claims.

What is claimed is:

1. An exciter circuit for use with an igniter for creating a spark for igniting fuel in an engine; comprising:
    a charge pump circuit for selectively applying power to an input of a voltage conversion device having a first output, said device being configured to step-up a first voltage level applied to said input to a higher second voltage level at said voltage conversion device first output;
    a main energy store having positive and negative terminals, said positive terminal being connected in circuit to said first output for receiving energy from said charge pump circuit, said negative terminal being connected to the igniter via a ground loop circuit having a step-up pulse transformer therein;
    a semiconductor switch having an anode, a cathode and a gate for controlling the release of energy from said main energy store, said cathode being directly connected to ground and said anode being connected to said positive main energy store terminal; and, a trigger circuit connected to said charge pump circuit and to said gate and selectively applying a trigger signal to said gate for placing said switch into conduction thereby discharging said energy store directly to ground, said ground loop circuit producing negative current through said step-up pulse transformer to said negative terminal and thereby creating a high voltage negative pulse that is applied to the igniter for creating a spark.

2. An exciter circuit as defined in claim 1 wherein said voltage conversion device has a second output with a higher third voltage level and said trigger circuit further comprises a tertiary energy store that supplies said trigger signal to said gate via a trigger switch having a control input, said trigger switch being placed into conduction when an actuating signal is received from said charge pump circuit.

3. An exciter circuit as defined in claim 2 wherein said trigger circuit further comprises:
- a first diode having its anode connected to said tertiary energy store and its cathode connected in series to an inductor that is connected in series with said gate; and
- a second diode that has its cathode connected to said inductor and to said first diode cathode, said second diode having its anode connected to ground;
- said first and second diodes and said inductor being tuned to insure positive current flow to said gate during the turn-on time period of said semiconductor switch.

4. An exciter circuit as defined in claim 3 wherein said trigger switch is a thyristor having an anode, a cathode and a gate, said gate being said control input and said cathode being connected to said first diode.

5. An exciter circuit as defined in claim 4 wherein said trigger circuit further comprises a switching transistor connected to ground and to a primary winding of a transformer that is connected to an energy storing capacitor, said switching transistor being switched into conduction by said actuating signal and causing said energy to flow through said transformer and transistor to ground, said transformer having a secondary winding that is connected to said thyristor gate via a rectifier diode, whereby current flows to said thyristor gate when said switching transistor is switched into conduction.

6. An exciter circuit as defined in claim 2 wherein said tertiary energy store comprises at least one capacitor having a capacitance of at least approximately 0.05 micro-Farad.

7. An exciter circuit as defined in claim 1 wherein said ground loop circuit comprises an in series connection from said negative terminal of said main energy store through a primary coil of said step-up pulse transformer, a pulse capacitor to ground.

8. An exciter circuit as defined in claim 1 wherein said second voltage level is within the range of about 1500 to about 1950 volts DC.

9. An exciter circuit as defined in claim 1 wherein said main energy store comprises at least one capacitor having a capacitance of at least approximately 1 micro-Farad.

10. An exciter circuit as defined in claim 1 wherein said high voltage pulse has a magnitude within the range of about −15,000 to about −18,000 volts.

11. An exciter circuit for use with an igniter for creating a spark for igniting fuel in an engine; comprising:
- a charge pump circuit for selectively applying power to an input of a voltage conversion device having a first output, said device being configured to step-up a first voltage level applied to said input to a higher second voltage level at said voltage conversion device first output;
- a power supply circuit that is connectable to an external source of input power and provides a DC output having said first voltage level, a second lower internal voltage bus and a third temperature compensated precision reference voltage;
- a main energy store having positive and negative terminals, said positive terminal being connected in circuit to said first output for receiving energy from said charge pump circuit, said negative terminal being connected to the igniter via a ground loop circuit having a step-up pulse transformer therein;
- a semiconductor switch having an anode, a cathode and a gate for controlling the release of energy from said main energy store, said cathode being directly connected to ground and said anode being connected to said positive main energy store terminal; and,
- a trigger circuit connected to said charge pump circuit and to said gate and selectively applying a trigger signal to said gate for placing said switch into conduction thereby discharging said energy store directly to ground, said ground loop circuit producing negative current through said step-up pulse transformer to said negative terminal and thereby creating a high voltage negative pulse that is applied to the igniter for creating a spark.

12. An exciter circuit as defined in claim 11 wherein said voltage conversion device is a transformer having a primary winding as said input, said charge pump circuit further comprising:
- a switching transistor connected in series between a power source of said first voltage, said primary winding, a voltage sensing resistor and ground;
- logic circuitry for switching said switching transistor in and out of conduction:
- comparator circuitry connected to said switching transistor for comparing the voltage level of said voltage sensing resistor to a reference voltage and switching said transistor out of conduction when said voltage level exceeds said reference level.

13. An exciter circuit as defined in claim 12 further comprising scheduling circuitry for adjusting the voltage level of said voltage sensing resistor in proportion to a drop in said internal voltage bus so that operation of said charge pump circuit continues notwithstanding said internal voltage bus voltage drop.

14. An exciter circuit as defined in claim 12 wherein said charge pump circuit further comprises second comparator circuitry operatively connected to said trigger circuit for monitoring the voltage level of said tertiary energy store and for controlling said logic circuitry to switch said transistor out of conduction when said voltage of said tertiary energy store reaches a predetermined level.

15. An exciter circuit as defined in claim 14 wherein said charge pump circuit is powered by said power supply and said logic circuit includes a one shot multi-vibrator that when fired permits said switching transistor to be placed into conduction until said comparator circuitry switches said switching transistor out of conduction, said external source of input power comprising an electronic engine controller (EEC).

16. An exciter circuit as defined in claim 15 wherein said EEC is configured to selectively apply and terminate power to said exciter circuit as necessary to control the exciter circuitry in a manner that is necessary to control operation of the engine, said EEC terminating power to said exciter circuit resulting in disabling the operation of said charge pump circuit, including said logic circuitry until power is reapplied thereto, said EEC thereby selectively controlling the spark rate of said igniter.

17. An exciter circuit as defined in claim 16 wherein said power supply includes a diode at its output that provides said first voltage to said charge pump circuit to block reverse charge flow when power is terminated to said power supply, thereby facilitating rapid disablement of said charge pump circuit including said logic circuitry thereof.

18. An exciter circuit as defined in claim 14 wherein
said charge pump circuit is powered by said power supply and said logic circuit includes a flip-flop that when fired permits said switching transistor to be placed into conduction until said comparator circuitry switches said switching transistor out of conduction,
said power supply comprises at least one temperature compensated precision voltage regulator that provides a stable reference supply, said regulator providing an auxiliary output voltage that is proportional to the temperature of the regulator,
said exciter circuit further comprising a voltage controlled oscillator having said auxiliary output voltage as an input thereto and generates a high frequency DC-DC chopper output frequency that is operatively connected to said flip-flop.

19. An exciter circuit as defined in claim 14 wherein said predetermined level of said tertiary energy store is proportional to said second voltage level.

20. An exciter circuit as defined in claim 12 wherein said logic circuitry further comprises an oscillator integrated circuit that generates a high frequency DC-DC chopper output frequency and includes multiple inputs for controlling hardware programmable divide-by-n circuitry that divides the high chopper output frequency down to a rate that is within the range of approximately 1 Hz to approximately 8 Hz, thereby establishing the exciter discharge repetition rate.

21. An exciter circuit as defined in claim 20 wherein said power supply comprises at least one temperature compensated precision voltage regulator that provides a stable reference supply, said regulator providing an auxiliary output voltage that is proportional to the temperature of the regulator, said exciter circuit further comprising rate adjusting circuitry having said auxiliary output voltage as an input thereto and an output that is operatively connected to at least one of said multiple inputs that control said divide-by-n circuitry, to thereby vary said discharge repetition rate in proportion to said regulator temperature.

22. An exciter circuit for use with an igniter for creating a spark for igniting fuel in a turbine engine; comprising:
a charging circuit for storing energy in an energy store having positive and negative terminals, said negative terminal being connected to the igniter via a ground loop circuit having a step-up pulse transformer therein;
a semiconductor switch having an anode, a cathode and a gate for controlling the release of energy from said energy store, said cathode being directly connected to ground and said anode being connected to said positive energy store terminal; and,
a trigger circuit connected to said charging circuit and to said gate and selectively applying a trigger signal to said gate for placing said semiconductor switch into conduction, thereby discharging said energy store to ground, said ground loop circuit producing negative current through said step-up pulse transformer to said negative terminal and thereby creating a negative high voltage pulse that is applied to the igniter for creating the spark.

23. An exciter circuit as defined in claim 22 wherein said trigger circuit provides a continuous positive current into said gate during the period of time said semiconductor switch is turning on.

24. An exciter circuit as defined in claim 23 wherein said trigger circuit further comprises:
a tertiary energy store operatively connected to said charging circuit for charging the same;
a first diode having its anode connected to said tertiary energy store and its cathode connected in series to an inductor that is connected in series with said gate; and
a second diode that has its cathode connected to said inductor and to said first diode cathode, said second diode having its anode connected to ground;
said first and second diodes and said inductor being tuned to insure positive current flow to said gate during the turn-on time period of said semiconductor switch.

25. An exciter circuit for use with an igniter for creating a spark for igniting fuel in a turbine engine; comprising:
at least one energy storing device for storing energy that is released to the igniter for creating the spark for igniting fuel in the turbine engine;
a charging circuit for storing energy in the energy store;
a discharge circuit including a semiconductor switch having an anode, a cathode and a gate, said switch controlling the release of energy from said energy store, said cathode being directly connected to ground and said anode being connected to said positive energy store terminal, a step-up pulse transformer with a primary winding connected to said negative terminal and to ground through a capacitor and a secondary winding connected to the igniter;
a trigger circuit for placing said semiconductor switch into conduction, thereby discharging said energy store to ground and producing a negative current through said step-up pulse transformer to said negative terminal and thereby creating a negative high voltage pulse that is applied to the igniter for creating the spark.

26. An exciter circuit as defined in claim 25 wherein said primary winding and capacitor comprise a first leg, said discharge circuit further comprising a resister leg and a diode leg connected in parallel said first leg, said diode having its cathode connected to ground.

27. An exciter circuit as defined in claim 25 wherein said semiconductor switch has a low leakage current at elevated temperatures and high junction temperature capability.

28. An exciter circuit as defined in claim 27 wherein said leakage current is approximately 200 microamperes at approximately 135 degrees Celsius.

29. An exciter circuit as defined in claim 25 wherein said energy store is charged within a time period that is approximately the reciprocal of the spark rate of the exciter.

30. A solid state turbine engine ignition exciter comprising;
at least one capacitor for storing energy that is released to the igniter for creating the spark for igniting fuel in the turbine engine;
a circuit for charging said capacitor;
a discharge circuit including a semiconductor switch for releasing energy from said capacitor directly to ground and then through a ground loop circuit whereby negative polarity energy is applied to the igniter; and
a trigger circuit for placing said semiconductor switch into conduction.

31. An exciter circuit for use with an igniter for creating a spark for igniting fuel in an engine; comprising:
- a charge pump circuit for selectively applying power to an input of a voltage conversion device having a first output, said device being configured to step-up a first voltage level applied to said input to a higher second voltage level at said voltage conversion device first output;
- a main energy store having positive and negative terminals, said positive terminal being connected in circuit to said first output for receiving energy from said charge pump circuit, said negative terminal being connected directly to ground;
- a semiconductor switch having an anode, a cathode and a gate for controlling the release of energy from said main energy store, said cathode being directly connected to ground and to the igniter through a pulse forming network and said anode being connected to said positive main energy store terminal; and,
- a trigger circuit connected to said charge pump circuit and to said gate and selectively applying a trigger signal to said gate for placing said switch into conduction thereby discharging said energy store through said pulse forming network and applying negative polarity energy to the igniter for creating a spark.

32. An exciter circuit as defined in claim 31 wherein said voltage conversion device has a tertiary winding providing a second output with a higher third voltage level and said trigger circuit further comprises a tertiary energy store that supplies said trigger signal to said gate via a trigger switch having a control input, said trigger switch being placed into conduction when an actuating signal is received from said charge pump circuit.

33. An exciter circuit as defined in claim 32 wherein said trigger circuit further comprises:
- a first diode having its anode connected to said tertiary energy store and its cathode connected in series to an inductor that is connected in series with said gate; and
- a second diode that has its cathode connected to said inductor and to said first diode cathode, said second diode having its anode connected to said cathode of said semiconductor switch and to said tertiary winding;
- said first and second diodes and said inductor being tuned to insure positive current flow to said gate during the turn-on time period of said semiconductor switch.

34. An exciter circuit as defined in claim 33 wherein said trigger switch is a thyristor having an anode, a cathode and a gate, said gate being said control input and said cathode being connected to said first diode.

35. An exciter circuit as defined in claim 34 wherein said trigger circuit further comprises a switching transistor connected to ground and to a primary winding of a transformer that is connected to an energy storing capacitor, said switching transistor being switched into conduction by said actuating signal and causing said energy to flow through said transformer and transistor to ground, said transformer having a secondary winding that is connected to said thyristor gate via a rectifier diode, whereby current flows to said thyristor gate when said switching transistor is switched into conduction.

36. An exciter circuit as defined in claim 31 further comprising a power supply circuit that is connectable to an external source of input power and provides a DC output having said first voltage level, a second lower internal voltage bus and a third temperature compensated precision reference voltage.

37. An exciter circuit as defined in claim 36 wherein said voltage conversion device is a transformer having a primary winding as said input, said charge pump circuit further comprising:
- a switching transistor connected in series between a power source of said first voltage, said primary winding, a voltage sensing resistor and ground;
- logic circuitry for switching said switching transistor in and out of conduction:
- comparator circuitry connected to said switching transistor for comparing the voltage level of said voltage sensing resistor to a reference voltage and switching said transistor out of conduction when said voltage level exceeds said reference level.

38. An exciter circuit as defined in claim 37 further comprising scheduling circuitry for adjusting the voltage level of said voltage sensing resistor in proportion to a drop in said internal voltage bus so that operation of said charge pump circuit continues notwithstanding said internal voltage bus voltage drop.

39. An exciter circuit as defined in claim 37 wherein said charge pump circuit further comprises second comparator circuitry operatively connected to said trigger circuit for monitoring the voltage level of said tertiary energy store and for controlling said logic circuitry to switch said transistor out of conduction when said voltage of said tertiary energy store reaches a predetermined level.

40. An exciter circuit as defined in claim 39 wherein said charge pump circuit is powered by said power supply and said logic circuit includes a one shot multi-vibrator that when fired permits said switching transistor to be placed into conduction until said comparator circuitry switches said switching transistor out of conduction, said external source of input power comprising an electronic engine controller (EEC).

41. An exciter circuit as defined in claim 40 wherein said EEC is configured to selectively apply and terminate power to said exciter circuit as necessary to control the exciter circuitry in a manner that is necessary to control operation of the engine, said EEC terminating power to said exciter circuit resulting in disabling the operation of said charge pump circuit, including said logic circuitry until power is reapplied thereto, said EEC thereby selectively controlling the spark rate of said igniter.

42. An exciter circuit as defined in claim 41 wherein said power supply includes a diode at its output that provides said first voltage to said charge pump circuit to block reverse charge flow when power is terminated to said power supply, thereby facilitating rapid disablement of said charge pump circuit including said logic circuitry thereof.

43. An exciter circuit as defined in claim 39 wherein
- said charge pump circuit is powered by said power supply and said logic circuit includes a flip-flop that when fired permits said switching transistor to be placed into conduction until said comparator circuitry switches said switching transistor out of conduction,
- said power supply comprises at least one temperature compensated precision voltage regulator that provides a stable reference supply, said regulator providing an auxiliary output voltage that is proportional to the temperature of the regulator,
- said exciter circuit further comprising a voltage controlled oscillator having said auxiliary output voltage as an input thereto and generates a high frequency DC-DC chopper output frequency that is operatively connected to said flip-flop.

44. An exciter circuit as defined in claim 37 wherein said logic circuitry further comprises an oscillator integrated circuit that generates a high frequency DC-DC chopper output frequency and includes multiple inputs for controlling hardware programmable divide-by-n circuitry that divides the high chopper output frequency down to a rate that is within the range of approximately 1 Hz to approximately 8 Hz, thereby establishing the exciter discharge repetition rate.

45. An exciter circuit as defined in claim 44 wherein said power supply comprises at least one temperature compensated precision voltage regulator that provides a stable reference supply, said regulator providing an auxiliary output voltage that is proportional to the temperature of the regulator, said exciter circuit further comprising rate adjusting circuitry having said auxiliary output voltage as an input thereto and an output that is operatively connected to at least one of said multiple inputs that control said divide-by-n circuitry, to thereby vary said discharge repetition rate in proportion to said regulator temperature.

46. An exciter circuit for use with an igniter for creating a spark for igniting fuel in a turbine engine; comprising:
  a power supply configured to be connected to an electronic engine controller (EEC) which selectively provides power for powering said exciter circuit;
  a charge pump circuit for storing energy in an energy store through a step-up transformer;
  a semiconductor switch having an anode, a cathode and a gate for controlling the release of energy from said energy store, said cathode being tied to ground potential; and
  a trigger circuit connected to said charge pump circuit and to said gate and selectively applying a trigger signal to said gate for placing said semiconductor switch into conduction, thereby discharging said energy store to produce negative polarity energy to create a spark for igniting fuel in the turbine engine;
  the EEC selectively terminating and supplying power to said exciter circuit to thereby control the occurrence and therefore the spark rate of said igniter.

47. An exciter circuit as defined in claim 46 wherein said exciter circuit alternatively charges and discharges said energy store at a first nominal rate when generally continuously powered by the EEC, said exciter circuit generating an auxiliary output voltage that is proportional to the temperature of at least one selected exciter circuit component, said exciter circuit adjusting said first nominal rate as a function of said component temperature.

48. An exciter circuit as defined in claim 47 wherein said first nominal rate decreases as said component temperature increases.

* * * * *